(12) United States Patent
Kymissis

(10) Patent No.: US 7,858,975 B2
(45) Date of Patent: *Dec. 28, 2010

(54) ORGANIC FIELD EFFECT TRANSISTOR SYSTEMS AND METHODS

(75) Inventor: Ioannis Kymissis, New York, NY (US)

(73) Assignee: The Trustees Of Columbia University in the City of New York, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/047,133

(22) Filed: Mar. 12, 2008

(65) Prior Publication Data

US 2008/0309412 A1    Dec. 18, 2008

Related U.S. Application Data

(60) Provisional application No. 60/894,367, filed on Mar. 12, 2007.

(51) Int. Cl.
*H01L 29/08* (2006.01)
*H01L 21/00* (2006.01)

(52) U.S. Cl. .......... 257/40; 257/E33.001; 257/E25.008; 257/E51.018; 438/82; 438/99

(58) Field of Classification Search .................. 438/82, 438/99; 257/40, E33.001, E25.008, E51.018, 257/E51.009; 313/504, 506; 428/690, 917
See application file for complete search history.

(56) References Cited

U.S. PATENT DOCUMENTS

| 4,110,616 | A | 8/1978 | Porter et al. |
| 4,258,259 | A | 3/1981 | Obara et al. |
| 6,500,604 | B1 | 12/2002 | Dimitrakopoulos |
| 6,696,370 | B2 | 2/2004 | Jackson |
| 7,119,366 | B2 * | 10/2006 | Kondoh ........................ 257/59 |

(Continued)

FOREIGN PATENT DOCUMENTS

JP         06186082         7/1994

(Continued)

OTHER PUBLICATIONS

Dimitrakopoulos, Christos D., et al., "Organic Thin Film Transistors for Large Area Electronics", *Advanced Materials 2002*, 14, No. 2, Jan. 16, 2002,19.

(Continued)

*Primary Examiner*—Hsien-ming Lee
(74) *Attorney, Agent, or Firm*—Schwegman, Lundberg & Woessner, P.A.

(57) ABSTRACT

An OFET includes a ferroelectric gate dielectric permitting electrical reprogramming, such as to implement an electrically re-programmable array logic (PAL) or a field-programmable gate array (FPGA). Methods of constructing such an OFET, PAL, or FPGA, can including roll printing. An OFET on a piezoelectric substrate provides local amplification in an active matrix. Methods of constructing such an OFET on a piezoelectric substrate can including rolling printing. Techniques permit direct measurement of trap distribution, such as across the channel length of an OFET device. Techniques permit direct measurement of the size and location of an electrically active grain structure in OFET devices. Techniques permit confirmation of the mechanism of operation of a number of OFET techniques, including use of silanes or thiols, or OFET operation or aging. Techniques provide an internal circuit probe, such as for a ferroelectric gate dielectric OFET or a piezoelectric substrate OFET, for example.

25 Claims, 9 Drawing Sheets

U.S. PATENT DOCUMENTS

| | | | |
|---|---|---|---|
| 7,368,715 B2 | 5/2008 | Watanabe | |
| 7,683,323 B2* | 3/2010 | Kymissis | 250/338.3 |
| 2003/0107067 A1* | 6/2003 | Gudesen | 257/295 |
| 2005/0170621 A1 | 8/2005 | Kim et al. | |
| 2006/0081889 A1 | 4/2006 | Shur et al. | |
| 2008/0283751 A1 | 11/2008 | Kymissis | |
| 2009/0066345 A1* | 3/2009 | Klauk et al. | 324/661 |
| 2009/0202083 A1* | 8/2009 | Kageyama | 381/59 |

OTHER PUBLICATIONS

Ji, TaekSoo , "Design and Fabrication of OTFT Based Flexible Piezoelectric Sensor", *Proc. of SPIE*, vol. 6528, 65281P-1, Nanosensors, Microsensors, and Biosensors and Systems 2007,6.

Kymissis, Ioannis , et al., "A Lithographic Process for Integrated Organic Field-Effect Transistors", *Journal of Display Technology*, vol. 1, No. 2, Dec. 2005, 6.

Kymissis, I. , et al., "An Organic Semiconductor Based Process for Photodetecting Applications", *IEEE, 2004 IEDM 04-377*, (2004),4.

Nitsche, W. , et al., "Application of Piezoelectric Foils in Experimental Aerodynamics", *IEEE*, 1989, Institut for Luft- And Raumfahrt der Technishen Universitat Berlin, Berlin (F.R.G.),(1989),9.

Schroeder, Raoul , et al., "Memory Performance and Retention of an All-Organic Ferroelectric-Like Memory Transistor", *IEEE Electron Device Letters*, vol. 26, No. 2, Feb. 2005, 3.

Someya, Takao , et al., "Integration of Organic Field-Effect Transistors and Rubbery Pressure Sensors for Artificial Skin Applications", *IEEE, 2003, IEDM 03-203*, (2003),4.

Stadlober, Barbara , et al., "Transparent Pyroelectric Sensors and Organic Field-effect Transistors with Fluorinated Polymers: Steps Towards Organic Infrared Detectors", *IEEE Transactions on Dielectrics and Electrical Insulation*, vol. 13, No. 5; Oct. 2006,(Apr. 25, 2006),10878-1092.

Unni, K.N. N., et al., "A Nonvolatile Memory Element Based on an Organic Field-Effect Transistor", *Applied Physics Letters*, vol. 85, No. 10, Sep. 6, 2004,3.

Zhou, Lisong , et al., "Pentacene TFT Driven AM OLED Displays", *IEEE Electron Device Letters*, vol. 26, No. 9, Sep. 2005,3.

"U.S. Appl. No. 12/077,723 , Non-Final Office Action mailed Jun. 2, 2009", 12 pgs.

"U.S. Appl. No. 12/077,723, Response filed Sep. 1, 2009 to Non Final Office Action mailed Jun. 2, 2009", 12 pgs.

"U.S. Appl. No. 12/077,723, Response Filed Sep. 1, 2009 to Non-Final Office Action mailed Jun. 2, 2009", 12 pgs.

"U.S. Appl. No. 12/077,723, Notice of Allowance mailed Nov. 3, 2009", 6 Pgs.

Birlikseven, C., et al., "A low-temperature pyroelectric study of PVDF thick films", *Journal of Materials Science: Materials in Electronics*, vol. 12, (2001), 601-603.

Marks, T. J., et al., "High-performance transparent thin-film trasistors", URL:http://spie.org/x8451.xml?pf=true&ArticleID=x8451, SPIE Newsroom, 29, (Jan. 29, 2007).

Martin, S., et al., "Gate-Planarized Organic Polymer Thin Film Transistors.", Journal of Electronic Materials,vol. 31, No. 5 URL: http://www.springerlink.conn/contenUf1u033461509431w, (2002), 512-519 pages.

Stadlober, Barbara, et al., "Transparent pyroelectric sensors and organic field-effect transistors with fluorinated polymers: steps towards organic infrared detectors", *IEEE Transactions on Dielectrics and Electrical Insulation*, 13(5), (2006), 1087-1092.

"U.S. Appl. No. 12/077,723, Examiner Interview Summary mailed Sep. 09, 2009", 4 pgs.

\* cited by examiner

ORGANIC FIELD EFFECT TRANSISTOR SYSTEMS AND METHODS

CLAIM OF PRIORITY

This patent application claims the benefit of priority, under 35 U.S.C. Section 119(e), to Kymissis U.S. Provisional Patent Application Ser. No. 60/894,367, entitled "SYSTEMS AND METHODS USING ORGANIC FIELD EFFECT TRANSISTORS," filed on Mar. 12, 2007, which is incorporated herein by reference in its entirety.

STATEMENT REGARDING FEDERALLY SPONSORED RESEARCH OR DEVELOPMENT

This invention was made with government support under contract ECS-0644656 awarded by NSF. The government has certain rights in the invention.

BACKGROUND

Thin film semiconductor technologies are useful in semiconductor processing and electronics. Such thin film semiconductor technologies can include organic field-effect transistors (OFETs).

OVERVIEW

This document describes, among other things, organic field-effect transistor systems, devices, and methods. Such description includes, by way of example, but not by way of limitation: (1) an OFET having a ferroelectric gate dielectric that permits electrical reprogramming, such as to implement an electrically re-programmable array logic (PAL) or a field-programmable gate array (FPGA); (2) methods of constructing such an OFET, PAL, or FPGA, including roll "printing"; (3) an OFET on a piezoelectric substrate for local amplification in an active matrix; (4) methods of constructing such an OFET on a piezoelectric substrate, including rolling "printing," (5) techniques that permit direct measurement of trap distribution, such as across the channel length of an OFET device; (6) techniques that permit direct measurement of the size and location of an electrically active grain structure in OFET devices; (7) techniques that permit confirmation of the mechanism of operation of a number of OFET techniques, including use of silanes or thiols, or OFET operation or aging; techniques that provide an internal circuit probe, such as for a ferroelectric gate dielectric OFET or a piezoelectric substrate OFET, for example.

Example 1 comprises a device. In this example, the device comprises a poled piezoelectric substrate. A conductive field-effect transistor (FET) gate is formed on the substrate. An organic gate dielectric is formed on the gate and on the substrate near the gate. A conductive FET source, formed on the gate dielectric near a first edge of the gate. A conductive FET drain is formed on the gate dielectric near a second edge of the gate that is located across the gate from the first edge of the gate. An organic semiconductor FET body region is formed on the gate, the source, and the drain. An organic passivation layer is formed on the semiconductor body region. The gate, the source, and the drain are configured as a FET amplifier to locally amplify a piezoelectric-generated charge, sensed at the gate from an local region of the substrate that is adjacent to the gate, into a resulting current between the source and drain.

In Example 2, the device of claim 1 is optionally configured such that the organic gate dielectric comprises parylene.

In Example 3, the device of one or more of Examples 1-2 is optionally configured such that the organic gate dielectric is spin-cast.

In Example 4, the device of one or more of Examples 1-3 is optionally configured such that the FET body region comprises pentacene.

In Example 5, the device of one or more of Examples 1-4 is optionally configured such that the passivation layer comprises parylene.

In Example 6, the device of one or more of Examples 1-5 is optionally configured such that the gate comprises chromium and the source or drain comprises gold.

In Example 7, the device of one or more of Examples 1-6 is optionally configured such that the poled piezoelectric substrate comprises polyvinylidene fluoride (PVDF).

In Example 8, the device of one or more of Examples 1-7 is optionally configured such that the poled piezoelectric substrate comprises a d31 piezoelectric matrix coefficient of at least 14 fC/N.

In Example 9, the device of one or more of Examples 1-8 is optionally configured such that the device is included in an two-dimensional array of the devices, wherein the devices in the array are individually addressable.

Example 10 describes a method. In this example, the method comprises forming a conductive field-effect transistor (FET) gate on a poled piezoelectric substrate. The method also comprises forming an organic gate dielectric, on the gate and on the substrate near the gate. The method also comprises forming a conductive FET source, on the gate dielectric near a first edge of the gate. The method also comprises forming a conductive FET drain, on the gate dielectric near a second edge of the gate that is located across the gate from the first edge of the gate. The method also comprises forming an organic semiconductor FET body region, on the gate, the source, and the drain. The method also comprises forming an organic passivation layer, on the semiconductor body region. The method also comprises configuring the gate, the source, and the drain as a FET amplifier to locally amplify a piezoelectric-generated charge, sensed at the gate from an local region of the substrate that is adjacent to the gate, into a resulting current between the source and drain.

In Example 11, the method of Example 10 optionally is performed such that forming the gate dielectric comprises spin-casting parylene, forming the semiconductor comprises depositing pentacene, and forming the passivation layer comprises depositing parylene.

In Example 12, the methods of one or more of Examples 10-11 optionally is performed such that forming the source and drain comprises depositing gold, and forming the gate comprises depositing chrome or gold.

In Example 13, the methods of one or more of Examples 10-12 optionally comprises forming a plurality of FETs by printing from a master to a target, wherein the master comprises a smaller surface area than the target.

In Example 14, the methods of one or more of Examples 10-13 optionally comprises printing from a substantially cylindrical master to a target sheet, comprising rolling the master along the target sheet.

Example 15 describes a method comprising providing a FET such as described in one or more of Examples 1-9. A piezoelectric-generated charge is sensed at the gate from a local region of the substrate that is adjacent to the gate. The piezoelectric-generated charge is locally amplified into a resulting current between the source and drain.

In Example 16, the method of Example 15 optionally comprises providing an array of the FET devices, and individually addressing different FET devices in the array to obtain an array of indications of the piezoelectric-generated charge at the FETs in the array.

Example 17 describes a device comprising a substrate. A conductive field-effect transistor (FET) gate is formed on the substrate. An organic ferroelectric gate dielectric is formed on the gate and on the substrate near the gate, and configured to permit electrically programmable adjustment of a FET threshold voltage to programmably configure a functionality of an electrical circuit. A conductive FET source is formed on the gate dielectric near a first edge of the gate. A conductive FET drain is formed on the gate dielectric near a second edge of the gate that is located across the gate from the first edge of the gate. An organic semiconductor FET body region is formed on the gate, the source, and the drain. An organic passivation layer, formed on the semiconductor body region.

In Example 18, the device of Example 17 is optionally configured such that the ferroelectric gate dielectric comprises a PVDF-TrFe copolymer.

In Example 19, the device of one or more of Examples 17-18 is optionally configured such that the ferroelectric gate dielectric is spin-cast.

In Example 20, the device of one or more of Examples 17-19 is optionally configured such that the FET body region comprises pentacene.

In Example 21, the device of one or more of Examples 17-20 is optionally configured such that the passivation layer comprises parylene.

In Example 22, the device of one or more of Examples 17-21 is optionally configured such that the gate comprises chromium or gold and the source or drain comprises gold.

In Example 23, the device of one or more of Examples 17-22 is optionally configured such that the ferroelectric gate dielectric comprises a ferroelectric dipole moment of at least $8 \times 10^8$ V·m³/cm².

In Example 24, the device of one or more of Examples 17-23 is optionally configured such that the device is included in a programmable logic array.

Example 25 describes a method comprising forming a conductive field-effect transistor (FET) gate on a substrate. An organic ferroelectric gate dielectric is formed on the gate and on the substrate near the gate, the ferroelectric gate dielectric comprising a ferroelectric property that permits electrically programmable adjustment of a FET threshold voltage to programmably configure a functionality of an electrical circuit. A conductive FET source is formed on the gate dielectric near a first edge of the gate. A conductive FET drain is formed on the gate dielectric near a second edge of the gate that is located across the gate from the first edge of the gate. An organic semiconductor FET body region is formed on the gate, the source, and the drain. An organic passivation layer is formed on the semiconductor body region.

In Example 26, the method of Example 25 is optionally performed such that forming the ferroelectric gate dielectric comprises spin-casting a PVDF-TrFE co-polymer, forming the semiconductor comprises depositing pentacene, and forming the passivation layer comprises depositing parylene.

In Example 27, the method of one or more of Examples 25-26 is optionally performed such that forming the source and drain comprises depositing gold, and forming the gate comprises depositing chrome or gold.

In Example 28, the method of one or more of Examples 25-27 optionally comprises forming a plurality of FETs by printing from a master to a target, wherein the master comprises a smaller surface area than the target.

In Example 29, the method of one or more of Examples 25-28 is optionally performed such that the printing comprises printing from a substantially cylindrical master to a target sheet, comprising rolling the master along the target sheet.

In Example 30, the method of one or more of Examples 25-29 optionally comprises individually electrically programming FETs of the plurality of FETs.

Example 31 comprises a method. In this Example, the method comprises providing a FET device, such as described in one or more of Examples 17-24. The method comprises electrically programming adjustment of a threshold voltage of the FET to programmably configure a functionality of an electrical circuit.

In Example 32, the method of Example 31 optionally comprises providing an array of the FET devices, and individually electrically programming adjustment of a threshold voltage of different FETs to represent a distinct logic state for that FET.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The 10 drawings illustrate generally, by way of example, but not by way of limitation, various embodiments discussed in the present document.

DETAILED DESCRIPTION

This document describes, among other things, organic field-effect transistor systems, devices, and methods. Such description includes, by way of example, but not by way of limitation: (1) an OFET having a ferroelectric gate dielectric that permits electrical reprogramming, such as to implement an electrically re-programmable array logic (PAL) or a field-programmable gate array (FPGA); (2) methods of constructing such an OFET, PAL, or FPGA, including roll "printing"; (3) an OFET on a piezoelectric substrate for local amplification in an active matrix; (4) methods of constructing such an OFET on a piezoelectric substrate, including rolling "printing," (5) techniques that permit direct measurement of trap distribution, such as across the channel length of an OFET device; (6) techniques that permit direct measurement of the size and location of an electrically active grain structure in OFET devices; (7) techniques that permit confirmation of the mechanism of operation of a number of OFET techniques, including use of silanes or thiols, or OFET operation or aging; techniques that provide an internal circuit probe, such as for a ferroelectric gate dielectric OFET or a piezoelectric substrate OFET, for example.

FIGS. 1A-1G show an example of a method of forming an electrically programmable FET device, and an example of a resulting FET device.

Figure 1A:
FIGS. 1A, 1B, 1C, 1D, 1E, 1F, and 1G show an example of a method of forming an electrically programmable FET device, and an example of a resulting FET device.

In FIG. 1A, a substrate 100 can be provided. In certain examples, the substrate 100 can include a glass (e.g., amorphous silicon) substrate. In certain examples, the substrate 100 can include a glass substrate upon which a polymer surface layer can be laminated or otherwise formed. In certain examples, the substrate 100 can include a flexible or rigid organic polymer film.

Figure 1B:
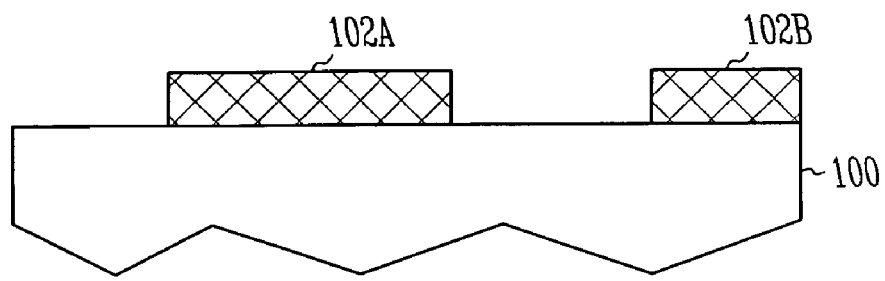

In FIG. 1B, a gate layer 102 can be formed on the substrate 100. In the example of FIG. 1B, the gate layer 102 can include a floating gate 102A and, e.g., for electrically programming the FET device, a control gate 102B. In certain examples, the gate layer 102 can be formed as a layer, and then selectively etched or otherwise patterned to leave the floating gate 102A separate from the control gate 102B. In certain examples, the gate later can be selectively formed with the floating gate 102A separate from the control gate 102B. In certain examples, the gate layer 102 comprises a combination of chromium and gold (e.g., a Cr/Au alloy), which can be deposited on the substrate 100.

Figure 1C:
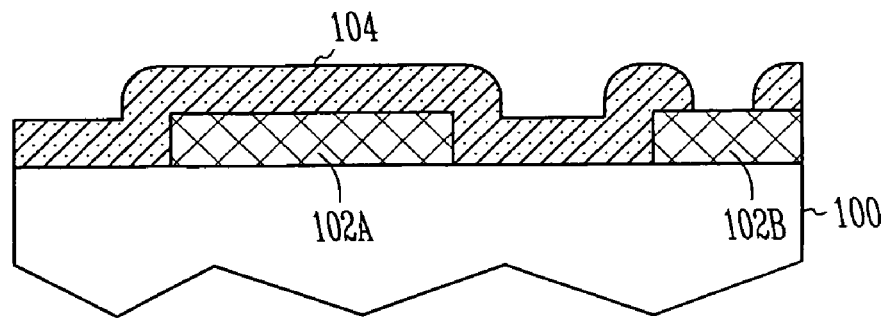

In FIG. 1C, a gate dielectric 104 is formed, such as on the floating gate 102A, on the control gate 102B, and on the substrate 100. Portions of the gate dielectric 104 can also serve as an inter-level dielectric. In certain examples, the gate dielectric 104 comprises an organic polymeric ferroelectric material, such as a polyvinylidene fluoride-trifluoroethylene (PVDF-TrFE) co-polymer, which can be spin-cast onto the working surface of the substrate 100 and over the floating gate 102A and the control gate 102B. The ferroelectric gate dielectric 104 can provide a spontaneous electric dipole moment, which in certain examples can be switched by the application of an external electric field (e.g., via the control gate 102B) such as to provide at least two distinct logic states. In certain examples, the ferroelectric gate dielectric comprises a ferroelectric dipole moment of at least $8 \times 10^8$ V·m$^3$/cm$^2$. In certain examples, the ferroelectric gate dielectric comprises a ferroelectric dipole moment of about $8 \times 10^{10}$ V·m$^3$/cm$^2$. In certain examples, the logic states can be read, such as by using a current between source and drain regions of the FET to distinguish between at least two distinct logic states.

Figure 1D:
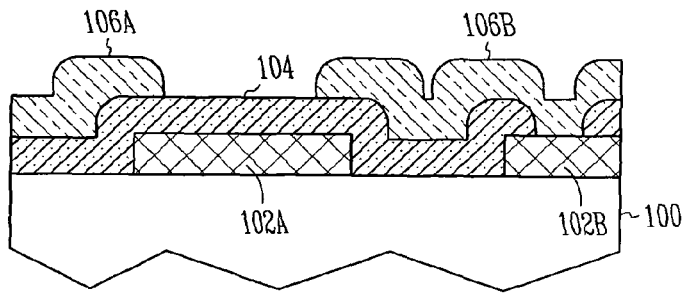

In FIG. 1D, an electrically conductive source/drain layer 106 can be formed and selectively patterned (or selectively formed) such as to form a source 106A and a drain 106B of the FET. In certain examples, forming the source/drain layer 106 can include depositing a layer of gold to form the source/drain layer 106.

Figure 1E:
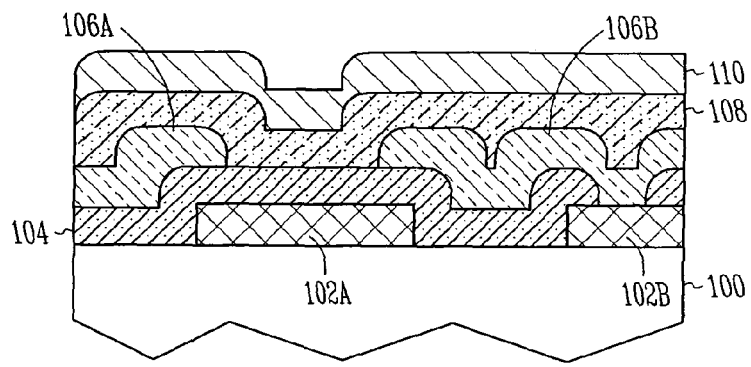

In FIG. 1E, a semiconductor layer 108 can be formed and selectively patterned (or selectively formed) such as to form a body region of the FET between the source 106A and the drain 106B of the FET. In certain examples, the semiconductor layer 108 includes a polymer or other organic material, such as pentacene, for example. In other examples, the semiconductor layer 108 can include one or more of merocyanines, pthalocyanines, amines, perylenes, benzidines, or one or more functionalized or neat polymers or oligomers of: acetylenes, acenes, thiophenes, pyrroles, vinylenes, thienothiophenes, anilines, fluorenes, imidines, or copolymers thereof, or combinations thereof.

Then, an encapsulation layer 110 can be formed on the semiconductor layer 108. In certain examples, forming the encapsulation layer 110 can include depositing a polymer or other organic material such as parylene on the semiconductor layer 108. In certain examples, the encapsulation layer can include one or more photosensitizable organic materials or water soluble materials, such as one or more of gelatin, albumin, casein, process glue, a natural gum, starch, nitrocellulose, alkylated cellulose, hydroxyalkylated cellulose, acylated cellulose, cellulose acetate, mixed cellulose ester, polyvinyl alcohol, polyvinyl acetal, polyvinyl butyral, halogenated polyvinyl alcohol, polyvinyl pyrrolidone, copolymers thereof, or combinations thereof. In certain examples, the encapsulation layer can include one or more vapor deposited or solution deposited materials, such as one or more parylenes, acrylics, polyimides, carbonates, polyvinyls, polyformaldehydes, polyethylenes, nylons, polyethyleneimines, polysilicones, polysiloxanes, polysilanes, polyfluorocarbons, polyureas, polyethylenes, polymelamines, cellulose, polysulfones, polyacrylamides, polyacrylonitriles, polybutadienes, polystyrenes, polycyanoacrylates, polychloroprene, polytrifluoroethylenes, polyvinilidines, polyacrylates, polymethacrylates, polyacetates, or polyvinylbutyral.

Figure 1F:
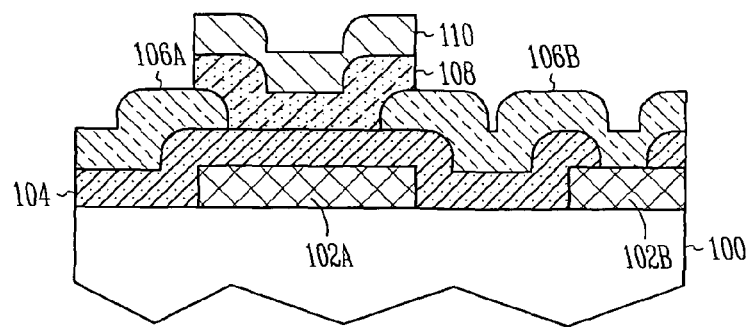

In FIG. 1F, portions of the encapsulation layer 110 and the semiconductor layer 108 can be selectively etched or otherwise selectively removed, such as to form separate and distinct body regions of different FETs.

Figure 1G:
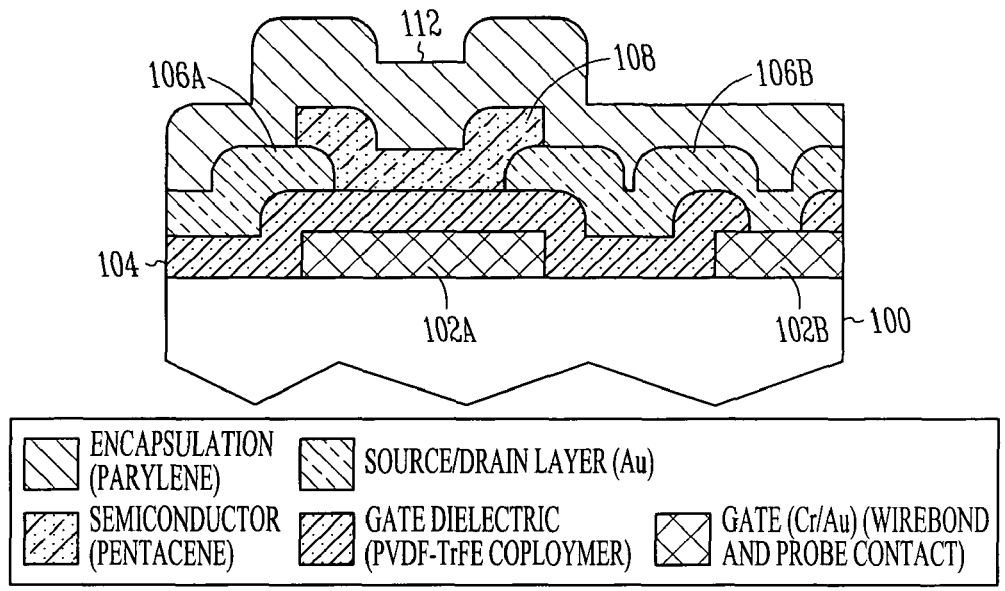

In FIG. 1G, a passivation or encapsulation layer 112 can then be formed on the working surface, such as over the distinct body regions of the different FETs, their source/drain regions, and elsewhere. In certain examples, the passivation or encapsulation layer 112 can include a polymer or other organic material, such as parylene. FIG. 1G shows an example of a resulting floating gate FET. By forming and interconnecting a plurality of such floating gate FETs, one or more electrical circuits can be created. In certain examples, such circuits can include an electrically re-programmable circuit, such as a PAL circuit, an FPGA, or the like. FIG. 1G also depicts a hatching schema used in the cross-sectional illustrations of FIGS. 1A-1G.

Figure 2:
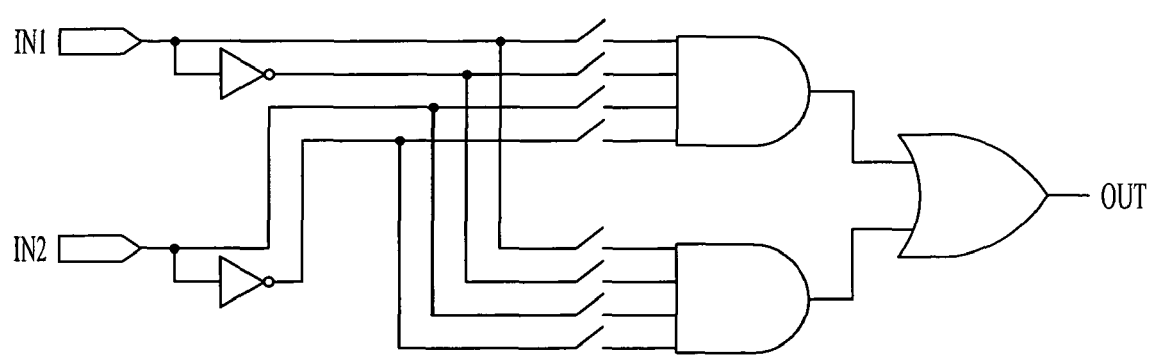
FIG. 2 shows an example of an equivalent circuit for a single programmable cell in such an electronic circuit.

FIG. 2 shows an example of an equivalent circuit for a single programmable cell in such an electronic circuit, such as a programmable pass transistor block or, if re-programmability is not desired, a programmable fuse array. Use of the ferroelectric gate dielectric described above permits programmability or re-programmability by moving the threshold voltage of the FET, such as above and below zero volts. In certain examples, a PAL can be constructed as a re-programmable or write-once (e.g., blown fuse) array, such as by using the equivalent circuit shown in FIG. 2. The programmability can be used to modify the functionality of a resulting electrical circuit.

Figure 3:
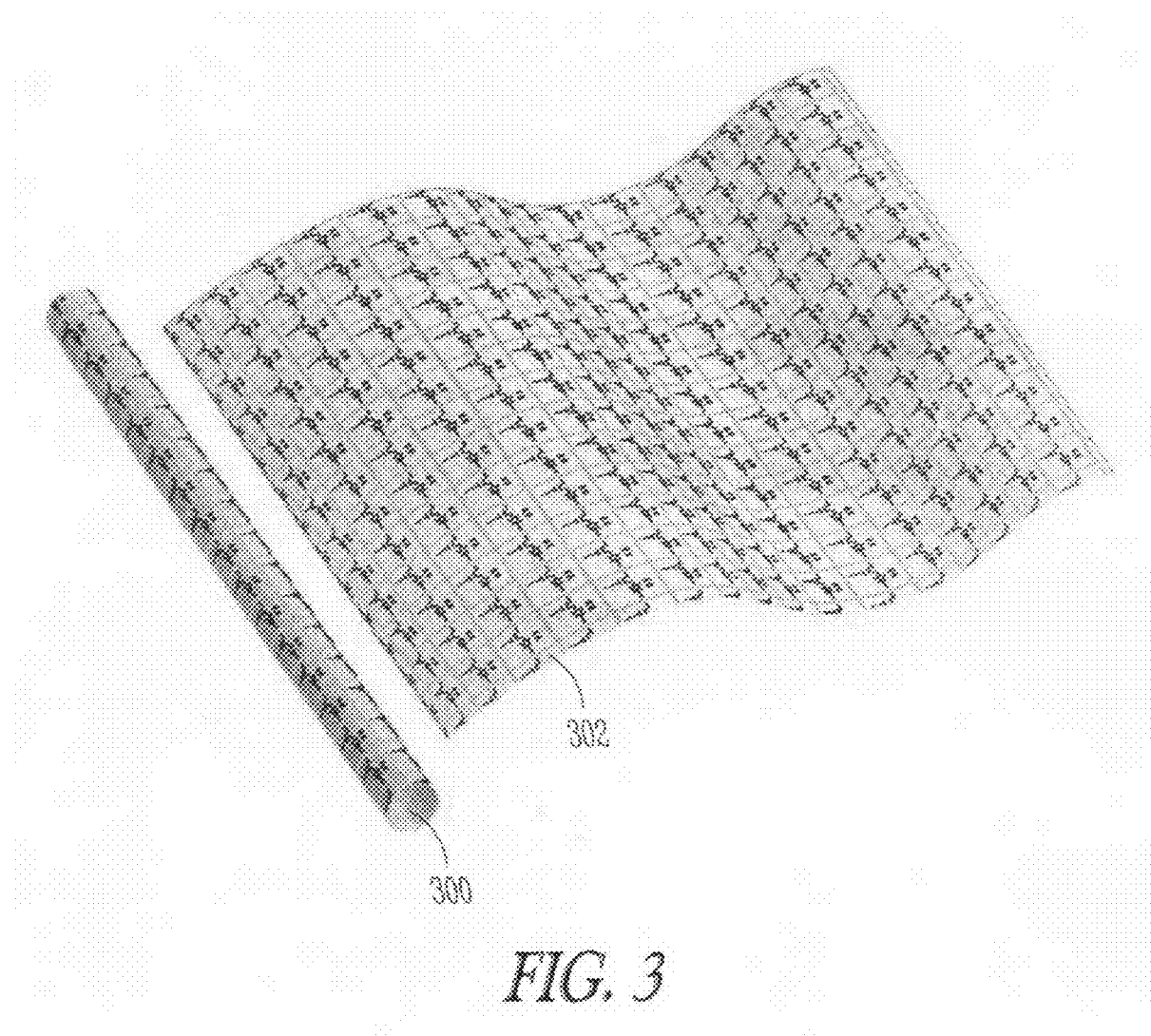
FIG. 3 shows an example of an apparatus and technique for mass-producing a potentially large scale programmable gate array.

FIG. 3 shows an example of an apparatus and technique for mass-producing a potentially large scale programmable gate array. In certain examples, like circuit elements can be generated using printing or another mass-production compatible technology. Individual circuit elements can then be programmed or otherwise defined to obtain the desired electrical circuit or system. The example of FIG. 3 illustrates a master cylinder 300 being rolled against an organic polymer or other flexible or rigid sheet 302 such as to "print" the desired circuit pattern on the sheet 302. In certain examples, the desired circuit pattern includes a two-dimensional array of circuit elements.

This re-programmability can also allow circuits to be programmed around defects in the underlying circuit elements. This can improve yield on giant circuit architectures, making such large-size circuits practicable. Use of like reprogrammable elements also allows use of a master 300 which can have a smaller surface area than the finished product sheet 302.

The present inventor has recognized, among other things, that the present OFET-based devices can be a good candidate for large area and inexpensive electronic technologies. They can provide flexibility and low thermal budget. This makes the present OFET devices compatible with inexpensive polymeric substrates. This also makes the present OFET devices potentially compatible with continuous flow printing technologies, which can provide mass production of low cost parts.

The present OFET-based PAL or FPGA, such as discussed above, can make many potential applications possible. For example, at the manufacturing stage, the circuit pattern can be made in like blocks. This can be especially advantageous for giant-size printed electronics where singulated patterning on the system scale may not be feasible. The example discussed above can provide a roll-master based technique in which the size of the master can be significantly smaller than that of the finished product. A programmable architecture could make such giant circuits more defect-tolerant. As size increases the probability of developing a defect on the panel increases as well. An architecture that can be programmed and defined after testing can be used to make giant-sized electronics more practical by eliminating the need for perfection to yield. Moreover, a PAL or FPGA architecture can be reprogrammed in the field, e.g., to implement a new cryptographic algorithm or pseudo-random sequence in a credit card-based electronic device. The roll-master process flow described above can also be used to create memory elements.

A number of variations can be used improve or optimize the FET devices including localized contact doping, grain boundary engineering, doping of the gate dielectric to control threshold voltage, or optimization of the deposition conditions and equipment design.

The present inventor has also recognized, among other things, that active matrix piezoelectric devices can expand the range of applications for piezoelectric materials. In certain examples, two-dimensional force sensing or imaging, steerable directional speakers, steerable directional microphones, or acoustic spectral selection can be possible, such as by coupling an active matrix backplane together with a thin film transistor.

Figure 4A:
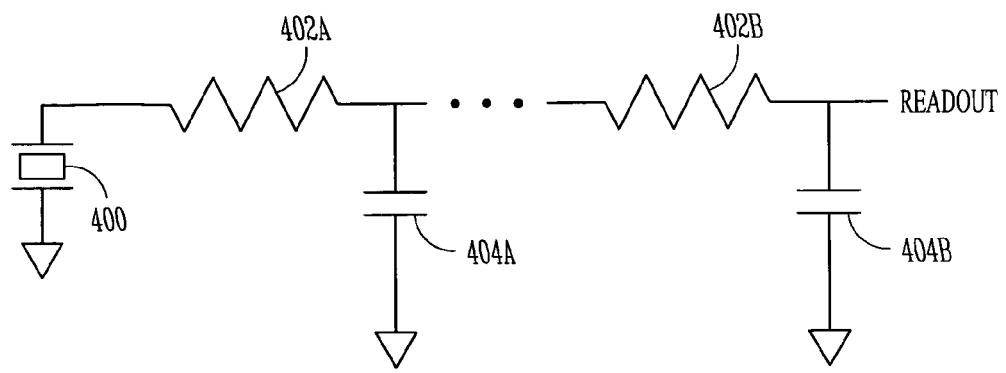
FIG. 4A illustrates an equivalent circuit for a piezoelectric material and a parasitic capacitive divider circuit that results from feeding the charge from the piezoelectric material out over a long distance toward a readout location.

The present inventor has recognized that thin film transistors can be placed on or near each pixel of such a backplane, such as to provide high resolution local detection of excitation in a large piezoelectric sheet. The amount of charge generated on polymer piezoelectric materials can be relatively small. FIG. 4A illustrates an equivalent circuit for a piezoelectric material 400, which generates charge via piezoelectric excitation, and a parasitic capacitive divider circuit formed by the distributed resistors 402 and distributed capacitors 404, which results from feeding the charge from the piezoelectric material 400 out over a long distance toward a readout location. The amount of distributed parasitic load capacitance increases as the sheet increases in size. This capacitive divider circuit, together with surface leakage or piezoelectric or pyroelectric excitation coupled in from other areas, can make sensing and measuring the induced charge of the piezoelectric material 400 challenging—particularly as the system is scaled toward a larger size. This can be especially challenging in an active matrix architecture in which, in certain examples, the capacitive loading increases due to capacitive coupling between the gates of the select transistors and the column lines of the pixels being read. In certain examples, even a small amount of surface leakage or leakage through the select transistors can degrade sensing of the piezoelectric-induced charge signal at 400. This can make sensing the piezoelectric-excited charge a race against the decay time. Moreover, the influence of neighboring piezoelectrically-excited areas can add an undesirable decay characteristic.

Figure 4B:
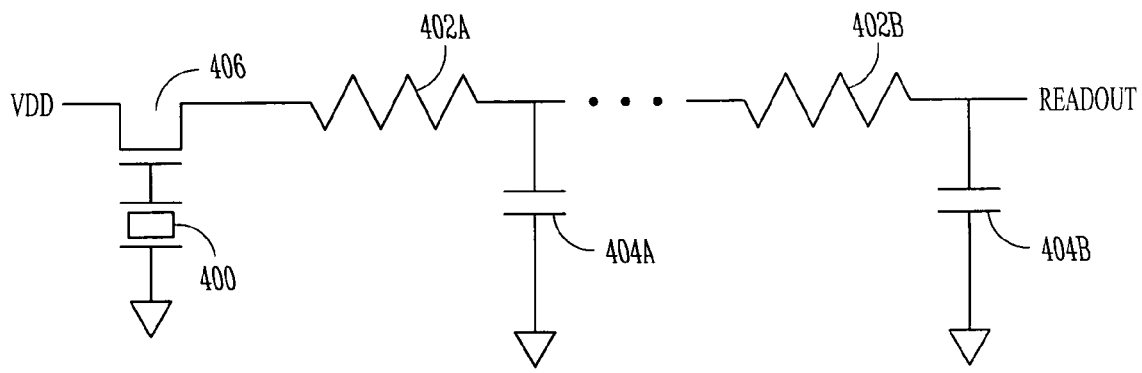
FIG. 4B shows an example in which a local charge amplifier is located at a particular location (e.g., a "pixel") of a piezoelectric sheet.

Accordingly, the present inventor has recognized that using a local amplifier (e.g., at each piezoelectric detector pixel) can solve virtually all of these problems. FIG. 4B shows an example in which a local charge amplifier 406 is located at a particular pixel 400 of a piezoelectric sheet. In a similar manner, the charge generated at each pixel area can be locally sensed and converted into a current by the local charge amplifier 406. The piezoelectric sheet charge can be entirely isolated from both from the amplifying transistor channel of the local charge amplifier 406, and from neighboring pixels, such as by using a high quality gate insulator layer (e.g., parylene), and can be capacitively coupled for local sensing and local amplification, thereby significantly reducing the decay of induced charge as a function of time.

Figure 4C:
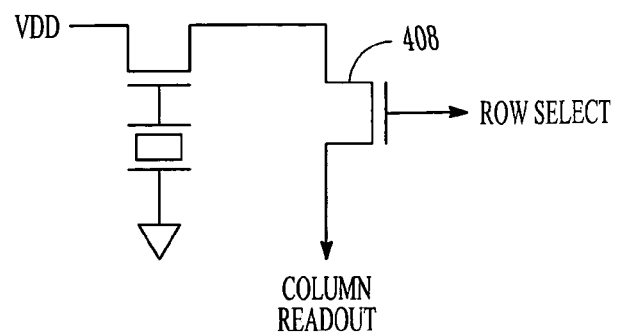
FIG. 4C shows an example in which a local charge amplifier can be used in a matrix, such as an active matrix.

Much can be gained from changing the sensing paradigm from detecting a small charge subject to parasitic effects to detecting and locally amplifying a charge into current, and performing the amplification nondestructively at the location of the piezoelectric excitation. Local amplification significantly increases the size over which this type of detection can be scaled. The locally amplified charge can now be transmitted to a remote location as an electrically conducted current. The communicated current will be substantially immune (e.g., in DC) to capacitive dividers, can be switched as a current in an interleaved active matrix (such as by using a row select and column readout transistor 408, as illustrated in FIG. 4C, and can be detected as a current such as by using peripheral sensing circuitry.

If one were to try to construct this architecture in amorphous silicon, there would be at least two challenges. First, the process temperature for silicon transistors of reasonable performance usually exceeds the Curie temperature for the piezoelectric materials used. This would involve adding the poled piezoelectric after transistor fabrication, such as by lamination or the like. This can limit the possible configurations. By contrast, in certain examples, the present approach permits the sensing and amplification transistor to be fabricated in place upon a poled piezoelectric substrate. Second, it is useful to mount a piezoelectric acoustic devices on a tensioned flexible film to couple well with air. Building amorphous silicon on a flexible film can be challenging. Using a flexible piezoelectric film substrate allows for greater displacement, since the substrate can travel in a direction normal to the plane of the substrate. This can reduce the mass that needs to be moved to actuate the device. This permits speakers, microphones, or drums to be made using this geometry.

The present OFETs allow fabrication below the Curie temperature of certain polymer piezoelectric materials (including polymer and co-polymer films). They also allow transistor fabrication directly on a flexible piezoelectric sheet, which can be tensioned to provide good acoustic coupling.

One possible application is aeronautical. A PVDF sheet can serve as an excellent airfoil turbulence detector. While it may be possible to form a hybrid structure with thinned silicon circuitry or small silicon tiles to make an active matrix, using OFETs as described herein can allow direct fabrication of the transistors using the piezoelectric film itself as the substrate. This allows for a highly scalable system.

The voltages achievable can depend on the nature of the piezoelectric excitation applied, but can be expected to range from millivolts to several volts for acoustic excitation of the piezoelectric material, and tens of volts for direct mechanical excitation. The local charge sensing and amplification transistor 406 can provides transconductance gain and conversion of the detected signal from a charge to a current. This can enhance the detection sensitivity without loading the signal down by drawing charge off of the piezoelectric film.

Figure 5A:
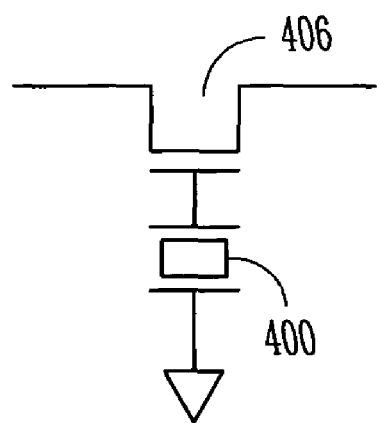
FIG. 5 illustrates an example of an electrical circuit diagram and an example of a corresponding cross-sectional view of a piezoelectric "pixel" that includes a piezoelectric element (such as a region of a piezoelectric film) and a local transistor charge amplifier.
Figure 5B:
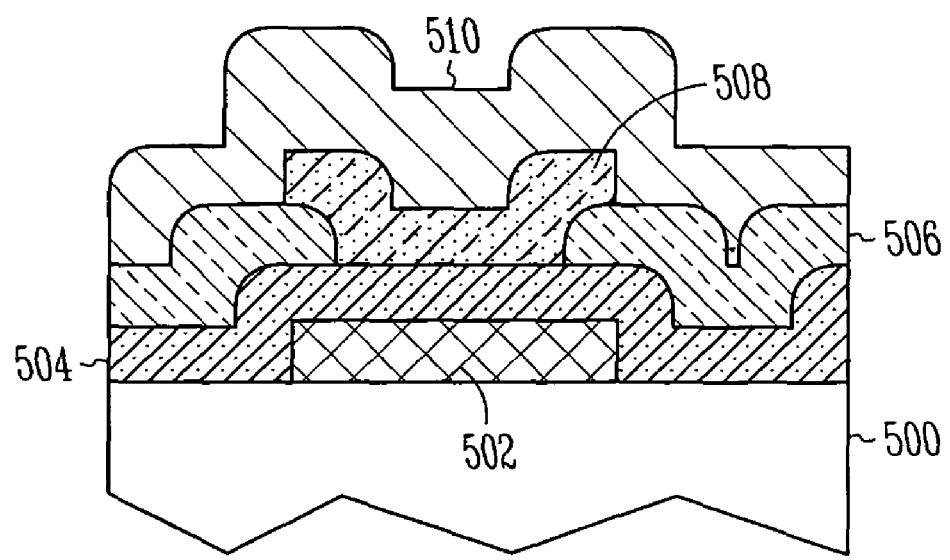

FIG. 5 illustrates an example of an electrical circuit diagram and an example of a corresponding cross-sectional view of a piezoelectric "pixel" that includes a piezoelectric element 400 (such as a region of a piezoelectric film) and a local transistor charge amplifier 406.

In this example, the substrate 500 comprises a poled piezoelectric film, such as PVDF or PVDF-TrFe. The poled piezoelectric film can be formed upon a flexible or rigid sheet, which can include a different material supporting the film, if desired. The poled piezoelectric film typically comprises a d31 piezoelectric matrix coefficient of at least 14 femtoCoulombs per Newton. For example, PVDF typically exhibits a d31 piezoelectric matrix coefficient of about 14 picoCoulombs per Newton. A gate 502 can be selectively formed on the substrate 500. In certain examples, the gate 502 includes a chromium material, which can be deposited on the substrate 500, if desired. A gate dielectric 504 can be formed on the gate 502 and portions of the substrate 500. In certain examples, the gate dielectric 504 can also serve as a smoothing layer. In certain examples, the gate dielectric 504 can include an organic polymer, such as parylene-C, which can be deposited on the gate 502 and portions of the substrate 500, if desired. A source/drain layer 506 can be selectively formed on the gate dielectric 504, such as at opposing edges of the gate region. In certain examples, the source/drain layer 506 can include gold, which can be selectively deposited or deposited and selectively etched on the gate dielectric 504, as desired. An FET body region 508 can be deposited or otherwise selectively formed on the gate dielectric between the source and drain regions of the FET. In certain examples, the FET body region 508 can include an polymer or other organic material, such as pentacene, for example. In other examples, the semiconductor body region 508 can include one or more of merocyanines, pthalocyanines, amines, perylenes, benzidines, or one or more functionalized or neat polymers or oligomers of: acetylenes, acenes, thiophenes, pyrroles, vinylenes, thienothiophenes, anilines, fluorenes, imidines, or copolymers thereof, or combinations thereof. A passivation or encapsulation layer 510 can then be deposited or otherwise formed over the FET body region 508 and elsewhere. In certain examples, the passivation layer 510 can include a polymer or other organic material, such as parylene-C, for example.

In certain examples, the process of fabricating the circuit shown in the example of FIG. 5 can use photolithographic patterning technology, which can use parylene to encapsulate the OFETs, and which can have a maximum process temperature that is below the Curie point temperature of the PVDF film 500.

The poled piezoelectric film 500, which can be flexible, can optionally be laminated onto a rigid support for processing, and then debonded from the support after such processing, if desired. The entire process can be conducted at temperatures that are below the Curie point of PVDF. This permits using PVDF film that has already been poled at the start of the process. PVDF films exhibiting the piezoelectric effect can be rough, e.g., with surface "corrugation" exceeding hundreds of nanometers. This can be due to the stretching process used to achieve an oriented crystalline film. The gate dielectric 504 can be engineered to provide a smoother surface than the underlying possibly rough piezoelectric substrate layer 500. This can involve using a spin-cast planarization layer, and then providing a low surface-state CVD polymer gate dielectric layer 504. This can help achieve suitable device performance and yield.

Thus, in the example of FIG. 5, excitation of the piezoelectric substrate film 500 can generate charge that couples to the transistor channel in the body region 508 and can be measured by examining the channel conductance. A globally addressed active matrix can be formed, such as by adding driven lines to the gate layer and using the same gate/inter level dielectric. It can also be desirable to collect the integrated charge over some fraction of the pixel area, such as by using a floating gate pixel flag. The above-described process can take into account these considerations.

Device characterization can be performed, such as I-V and C-V FET measurement, a measure of trapped charge, effective mobility, or the density of states in the channel. A probe can be used to detect the poling state of the polymer material in the ferroelectric or piezoelectric devices such as described above.

OFET characterization can make use of IEEE standard 1620. The OFET characteristics can be curve-fitted to long-channel silicon MOSFET models, in certain examples. While curve-fitting is both convenient and practical, trap limited conduction devices may not lend themselves well to modeling against band-like transport characteristics. This can lead to a significant variation in measured device performance, such as based on which assumptions are made in the curve-fit. For example, the error in determining the field-effect mobility can be a factor of two based on the threshold voltage estimated when the IEEE 1620 method is applied. Therefore, in addition to performing standard measurements, further tests can be applied to the OFET devices. Accurate device-level modeling used in device characterization can be used to appropriately link fabrication conditions with observed circuit-level performance characteristics. The effect that the non-linear injection barrier/contact resistance plays in the device can also be properly accounted for and the characterization system can extract and account for these effects.

In certain examples, a diagnostic probe can be used. The photocurrent response of OFETs can be used to probe the density of states in OFETs. This information can be used to link processing to circuit-level device characteristics, or to understanding process-induced doping phenomena.

In certain examples, the photocurrent can be used to probe the density of trap states in a deliberately doped OFET device and can be used to determine the depth of the induced trap states. In certain examples, an OFET device such as described above can be doped by applying an oxygen plasma to a parylene gate dielectric before depositing the semiconductor body region of the OFET. This can create a number of electronegative hydroxyl and hydronyl groups on the surface of the gate dielectric that dope the channel of the OFET. This can significantly change the threshold voltage of the OFET in a controllable way.

Figure 6A:
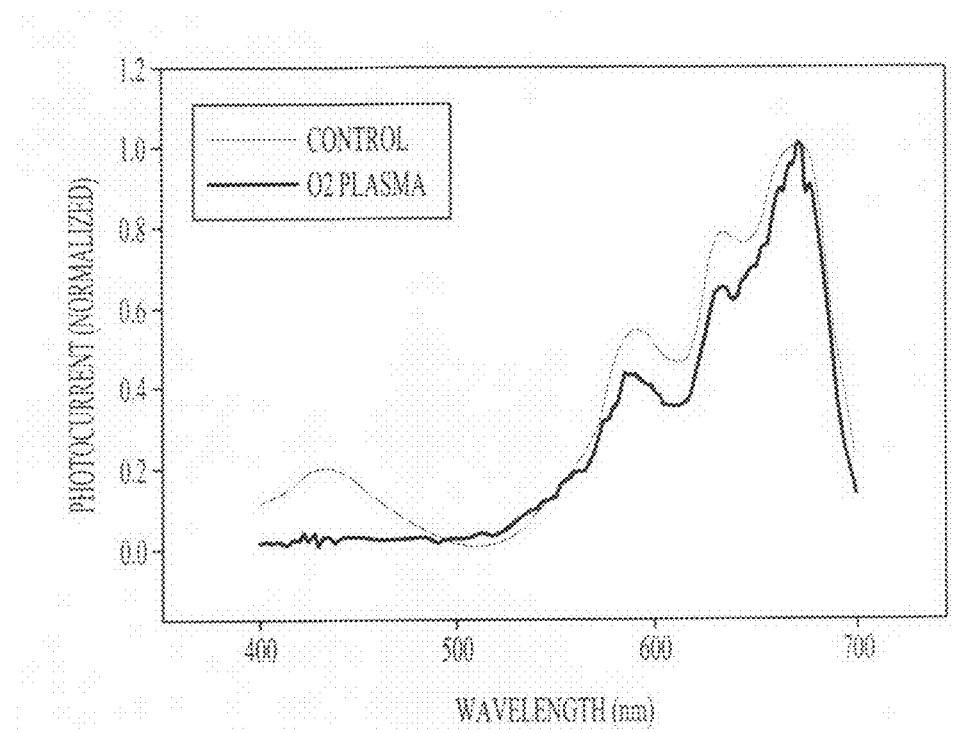
FIG. 6A shows an example of the photocurrent response for a doped pentacene OFET device and control (e.g., undoped) OFET device.
Figure 6B:
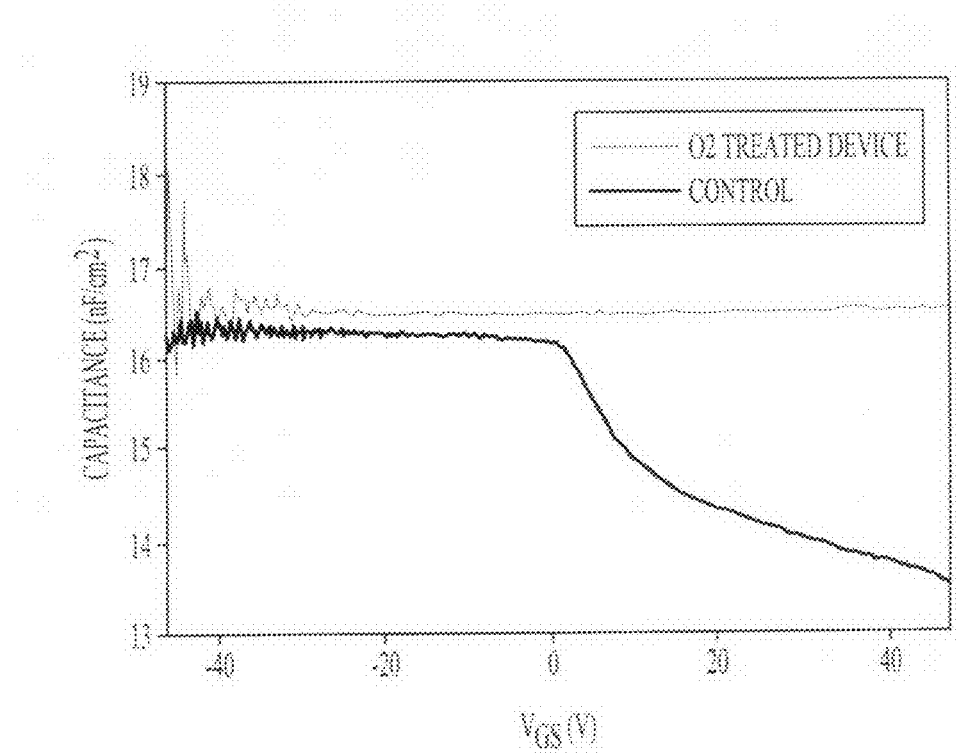
FIG. 6B shows an example of a C-V characteristic of the devices of FIG. 6A, illustrating an example of the effect of doping on the OFET transistor.

FIG. 6 shows an example of the photocurrent response for a doped OFET device and control (e.g., undoped) OFET device. In FIG. 6, the additional peak at around 420 nm (3.0 eV) is caused by the additional trap states induced by the doping treatment. This technique has the potential to directly measure the density and depth of traps at the interface between the pentacene or other semiconductor body region of the OFET and the gate dielectric of the OFET. These parameters would otherwise be more indirectly measured by examining device mobility and the apparent threshold voltage, which can also be affected by a number of other factors. The photocurrent response technique can also be used to examine various treatments, such as the use of polystyrene or the like to passivate a metal oxide dielectric with dangling bonds. The photocurrent response technique can also be used to tease apart morphological vs. doping advantages of using one or more passivation layers under or over the semiconductor FET body region, as well as the effect of silane or thiol treatments on the gate dielectric or contacts.

Figure 7:
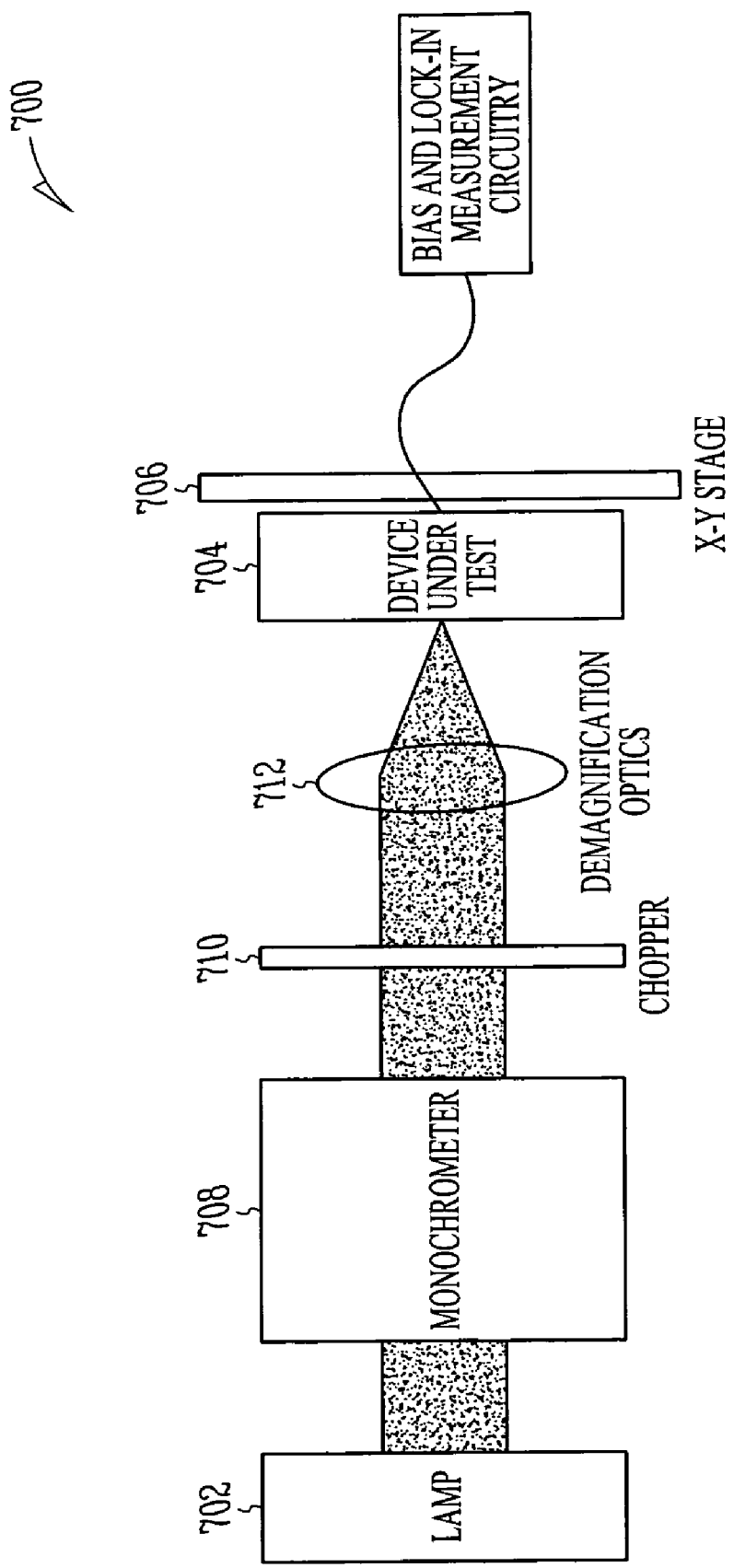
FIG. 7 illustrates an example of a general setup of an experimental apparatus that can measure photocurrent, such as in a spatially resolved fashion (e.g., across a device).

In addition or alternative to the flood photocurrent setup, an apparatus that can measure photocurrent in a spatially resolved fashion (e.g., across a device) can be built. FIG. 7 illustrates an example of a general setup of such an experimental apparatus 700. In this example, a lamp 702 can be used to illuminate a portion of a device under test 704 carried on a movable x-y stage 706. In this example, illumination from the lamp 702 can be provided through a monochrometer 708, a chopper 710, and demagnification optics 712. The demagnification optics 712 can include an aperture, which can be re-imaged on the substrate device under test 704 to form a small illumination spot, such as several micrometers in size.

Figure 8:
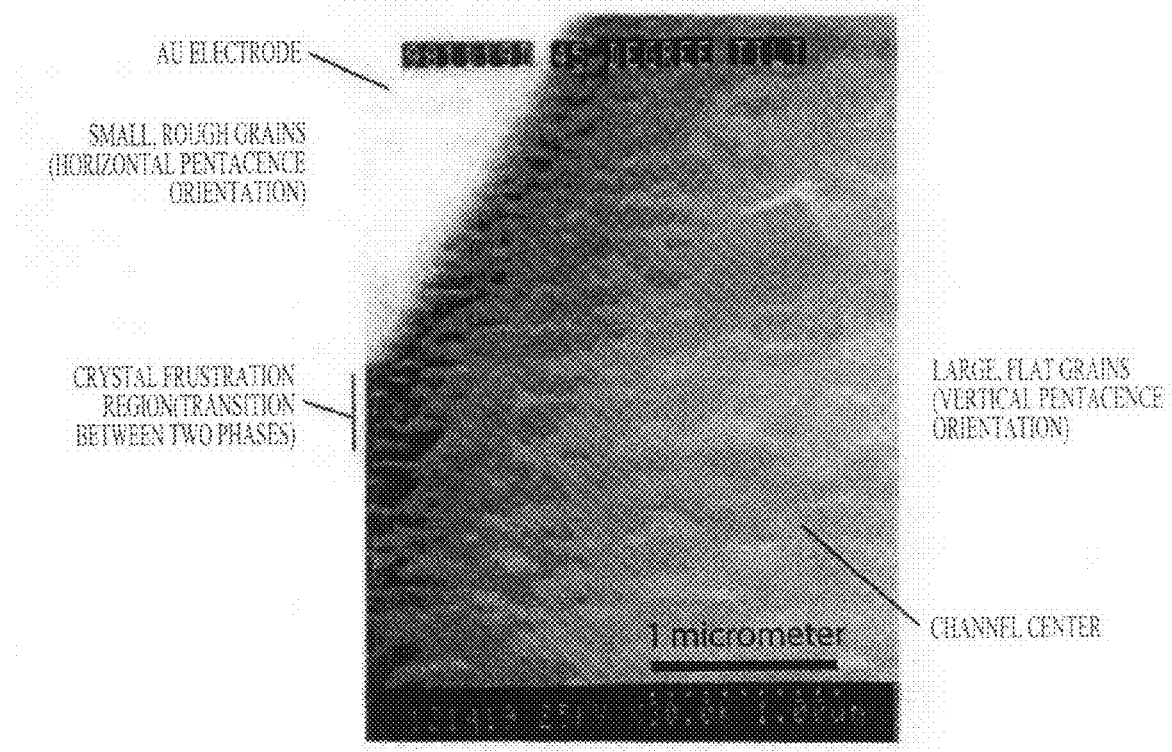
FIG. 8 shows an example of a scanning electron micrograph showing a transition between the electrode edge and the center of the channel. A frustration region, which corresponds to the transition between the growth of pentacene on gold to the growth in the center of the channel, is readily visible.

The apparatus 700 can be used to produce a spatially localized map of the states in the device under test 704. The ability to locate the trap states, especially at the contact edge, can be a powerful tool for evaluating the effect of device processing on OFET behavior, especially understanding and modeling non-linear contact/access resistance that can be observed in these devices. In bottom contact OFET devices, which can be significantly easier to manufacture since pentacene does not easily tolerate exposure to solvent, pentacene can grow differently on the source and drain contacts than it does in the center of the channel. This can lead to a crystal frustration region near the source or drain electrode edge (see FIG. 8). This crystal frustration region (and its associated trap states) are thought to cause inferior performance in bottom contact devices. However, the present measurement system and techniques permit a spatially resolved direct measurement of the generated trap states to be taken.

Figure 9:
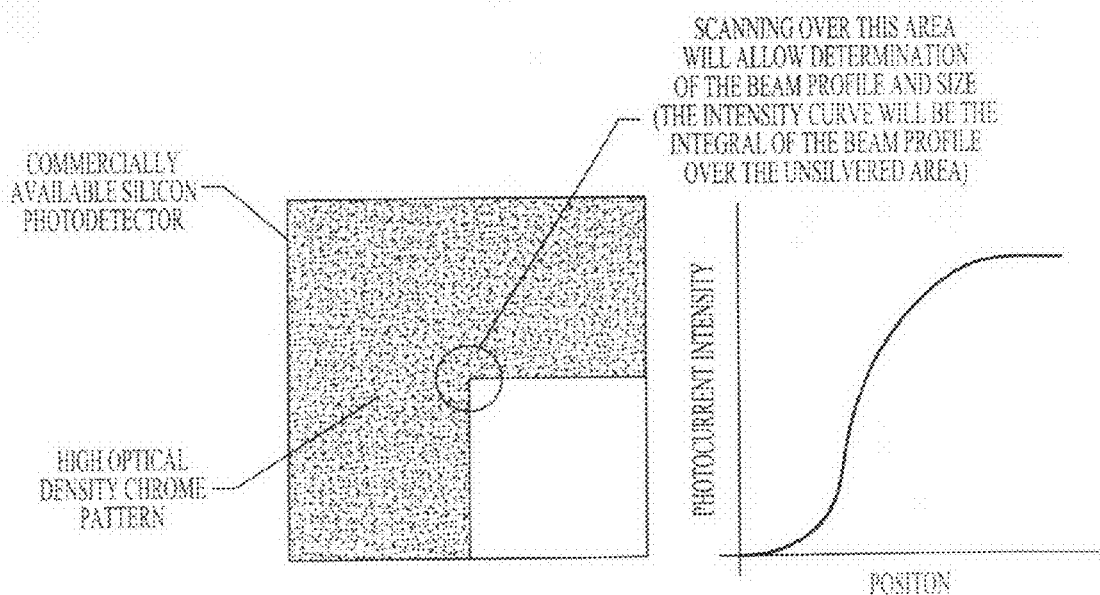
FIG. 9 shows an example of a method through which the beam profile can be determined at each wavelength. A commercially available silicon photodetector can have a chrome pattern applied to it. By scanning this pattern and deconvolving, the beam profile can be determined.

The profile and size of the light spot at each wavelength can be determined, such as by measuring the photocurrent from an apertured commercially available silicon photodetector. An opaque chrome layer with a sharp corner pattern can be defined by e-beam lithography, such as shown in FIG. 9, and used to determine the spot size, such as by scanning and measuring the photocurrent response. Diffractive and chromatic aberration effects can change the spot size slightly as a function of wavelength. Focusing can be accomplished by placing a camera with microscope optics on the opposing side of the sample, which can be on a transparent substrate and which can be made with a transparent or semi-transparent gate electrode.

By analyzing the resultant photocurrent image, the beam profile can be deconvolved. Several measurements can be taken, including:

1. Cross-sectional measurement of photocurrent along channel length for bottom and top contact OFETs. This measurement can determine if there is a measurable change in the photocurrent spectrum as a consequence of the crystal frustration that occurs along the channel edge.

2. Cross-sectional measurement of photocurrent along channel width, and two dimensional map of the channel area. This can indicate a degree of charge state homogeneity along the channel width, and can provide some indication if the process being used has trap 'hot spots' along the channel length, or is homogeneous.

3. Cross-sectional measurement of photocurrent along channel length, such as for deliberately doped contacts. This can indicate if the treatment of the electrodes with an electronegative thiol group creates measurable charge states in the channel edge that improve charge injection.

4. Comparison of photocurrent map for untreated electrodes and electrodes thiolated with a compound to improve ordering of the semiconductor grains along the channel edge. This can indicate the degree to which the crystal frustration region creates new active trap states, and can also further elucidate the mechanism through which thiolation of the electrodes improves performance.

5. Mapping of charge states in a device that has one or more enhancement treatments (such as thiols, passivation coatings, or silanes) applied non-uniformly through microcontact printing, in order to measure the impact the treatments have on a local scale.

Specific questions such study could potentially answer include:
Are there more electrically active traps in regions with more grain boundaries (such as the channel edge in bottom contact devices)?
Can these "trappy regions" be reduced or eliminated, such as through grain engineering, such as achieved by thiolating the contacts before growth?
Can the localized doping intended by the use of electronegative reagents on the contacts or gate dielectric be verified and directly measured?
Do devices conduct uniformly along the width of the channel, or are there conduction hot spots where injection is superior?
How does the photocurrent spectrum change as a function of bias conditions? It can be evaluated whether it is possible to directly observe trap filling under larger gate bias conditions through photocurrent, or whether polaron absorption effects dominate.
How are device-level performance metrics (such as mobility, threshold voltage, and contact/access barriers) linked to energy states in the device and are these links spatially homogeneous?

The spatially localized photocurrent technique can answer another interesting question: What is the electrically active grain size in polycrystalline OFETs? Polycrystalline oligomeric organic semiconductors (such as pentacene and hexithiophene) can grow through a Stranski-Krastanov growth mechanism, in which the first layer interacts strongly with the gate dielectric, providing a strong organizing force. Additional layers are generally aligned with the initial seed layer, but as more material deposits, the interaction with the substrate is reduced, and the film becomes progressively less ordered as thickness increases.

One correlation that can be studied is the effect of grain size on device performance (especially field-effect mobility). Grain size can also be examined by looking at the top surface of grown films through AFM or SEM and measuring the island size observed. However, this method can be inaccurate. It appears that the first few monolayers (which are the electrically active part of the device) can be well ordered on a size scale that is significantly larger than the mountains observed under microscopy of the top surface of the semiconductor. When polycrystalline organic thin films are observed under crossed polarizers, crystal alignment can be observed over regions that are an order of magnitude or more larger than the pyramids formed under Stranski-Krastanov growth. This implies that the pyramids that form on the large seed layer are also themselves aligned. There can also be a correlation between the direction of crystal faces of pyramid edges, which implies that the grains are aligned, further supporting this hypothesis. By polarizing the light used in the photocurrent measurement under gate bias, it can be possible to directly map the electrically active grain structure of the first few monolayers of the device by looking at the polarization direction of maximum photocurrent coupling. This could provide an electrically coupled measurement of grain size to address this question.

PVDF and PVDF-TrFE co-polymer materials are pyroelectric in addition to their ferroelectric and piezoelectric character. This allows probing of their poling state/dipole moment using thermal excitation. Using the same type of locked-in photocurrent measurement described above, but with a longer-wavelength excitation, it can be possible to probe the poling state of devices directly in complicated circuit topologies. By exciting selected single transistors or combinations of transistors, and analyzing the induced photocurrent at the circuit level, it can be possible to directly probe the magnitude and intensity of the polarization state of the pyroelectric material in the device without internal probing. This can be useful for mapping programmed states in the above-described programmable logic device as well as for mapping the uniformity of poling and monitoring any process-induced dipole relaxation in the piezoelectric local amplifier device described above.

The organic programmable logic device, such as described above, can be used as a fundamental building block useful for making giant circuits. The piezo-coupled transistor device enables an entirely new, locally amplified sensor to be built.

A number of possible sources of energy levels, both favorable and unfavorable, can be hypothesized. These include energy levels from chemical doping, structural defects introduced during the growth of the device, thermal cycling, and device operating stress. The technologies described herein could confirm or disprove these mechanisms and could be able to directly measure the energy levels contributed. The tools and techniques described can bring a new level of measurability and quantitative direction.

The photocurrent probe described above, in addition to potentially answering a number of fundamental questions, can also be suited for probing OFET circuits based on ferroelectric and piezoelectric materials. Because the ferroelectric and piezoelectric polymer materials are also generally pyroelectric, it can be possible to use IR or visible light excitation to probe the dipole state of individual transistors. This can be a helpful tool for debugging and testing the new device systems constructed.

The above-described OFET technology is believed to have good potential. The availability of low cost or large area electronics can significantly expand the range of electronic devices commercially viable in a number of device classes with significant societal impact, including, by way of example, but not by way of limitation, RFID, biometric authentication systems, inexpensive secure cryptographic tokens, large area sensors (such as direct imaging X-ray panels), and direct view display technologies such as active matrix OLED and LCD.

Additional Notes

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown and described. However, the present inventors also contemplate examples in which only those elements shown and described are provided.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code may be tangibly stored on one or more volatile or non-volatile computer-readable media during execution or at other times. These computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A device comprising:
    a poled piezoelectric substrate;
    a conductive field-effect transistor (FET) gate, formed on the substrate;
    an organic gate dielectric, formed on the gate and on the substrate near the gate;
    a conductive FET source, formed on the gate dielectric near a first edge of the gate;
    a conductive FET drain, formed on the gate dielectric near a second edge of the gate that is located across the gate from the first edge of the gate;
    an organic semiconductor FET body region, formed on the gate, the source, and the drain;
    an organic passivation layer, formed on the semiconductor FET body region; and
    wherein the gate, the source, and the drain are configured as a FET amplifier to locally amplify a piezoelectric-generated charge, sensed at the gate from a local region of the substrate that is adjacent to the gate, into a resulting current between the source and drain.

2. The device of claim 1, wherein the organic gate dielectric comprises spin-cast parylene, wherein the semiconductor FET body region comprises pentacene, wherein the passivation layer comprises parylene, and wherein the gate comprises chromium and the source or drain comprises gold.

3. The device of claim 1, wherein the poled piezoelectric substrate comprises polyvinylidene fluoride (PVDF).

4. The device of claim 1, wherein the poled piezoelectric substrate comprises a d31 piezoelectric matrix coefficient of at least 14 fC/N.

5. The device of claim 1, wherein the device is included in an two-dimensional array of the devices, wherein the devices in the array are individually addressable.

6. A method comprising:
    forming a conductive field-effect transistor (FET) gate, on a poled piezoelectric substrate;
    forming an organic gate dielectric, on the gate and on the substrate near the gate;
    forming a conductive FET source, on the gate dielectric near a first edge of the gate;
    forming a conductive FET drain, on the gate dielectric near a second edge of the gate that is located across the gate from the first edge of the gate;
    forming an organic semiconductor FET body region, on the gate, the source, and the drain;
    forming an organic passivation layer, on the semiconductor FET body region; and
    configuring the gate, the source, and the drain as a FET amplifier to locally amplify a piezoelectric-generated charge, sensed at the gate from a local region of the substrate that is adjacent to the gate, into a resulting current between the source and drain.

7. The method of claim 6, wherein:
    forming the gate dielectric comprises spin-casting parylene;
    forming the semiconductor FET body region comprises depositing pentacene; and
    forming the passivation layer comprises depositing parylene.

8. The method of claim 7 wherein:
    forming the source and drain comprises depositing gold; and
    forming the gate comprises depositing chrome or gold.

9. The method of claim 6, comprising forming a plurality of FETs by printing from a master to a target, wherein the master comprises a smaller surface area than the target.

10. The method of claim 9, wherein the printing comprises printing from a substantially cylindrical master to a target sheet, comprising rolling the master along the target sheet.

11. A method comprising:
    providing a FET device comprising:
        a poled piezoelectric substrate;
        a conductive field-effect transistor (FET) gate, formed on the substrate;
        an organic gate dielectric, formed on the gate and on the substrate near the gate;
        a conductive FET source, formed on the gate dielectric near a first edge of the gate;
        a conductive FET drain, formed on the gate dielectric near a second edge of the gate that is located across the gate from the first edge of the gate;
        an organic semiconductor FET body region, formed on the gate, the source, and the drain;
        an organic passivation layer, formed on the semiconductor FET body region; and
        wherein the gate, the source, and the drain are configured as a FET amplifier; and
    sensing a piezoelectric-generated charge at the gate from a local region of the substrate that is adjacent to the gate; and
    locally amplifying the piezoelectric-generated charge into a resulting current between the source and drain.

12. The method of claim 11, comprising
    providing an array of the FET devices; and
    individually addressing different FET devices in the array to obtain an array of indications of the piezoelectric-generated charge at the FET in the array.

13. A device comprising:
    a substrate;
    a conductive field-effect transistor (FET) gate, formed on the substrate;
    an organic ferroelectric gate dielectric, formed on the gate and on the substrate near the gate, and configured to permit electrically programmable adjustment of a FET threshold voltage to programmably configure a functionality of an electrical circuit;
    a conductive FET source, formed on the gate dielectric near a first edge of the gate;

a conductive FET drain, formed on the gate dielectric near a second edge of the gate that is located across the gate from the first edge of the gate;

an organic semiconductor FET body region, formed on the gate, the source, and the drain; an organic passivation layer, formed on the semiconductor FET body region; and wherein the gate, the source, and the drain are configured as a FET amplifier to locally amplify a piezoelectric-generated charge, sensed at the gate from a local region of the substrate that is adjacent to the gate, into a resulting current between the source and drain.

14. The device of claim 13, wherein the ferroelectric gate dielectric comprises a spin-cast PVDF-TrFe copolymer.

15. The device of claim 13, wherein the FET body region comprises pentacene, wherein the passivation layer comprises parylene, and wherein the gate comprises chromium or gold and the source or drain comprises gold.

16. The device of claim 13, wherein the ferroelectric gate dielectric comprises a ferroelectric dipole moment of at least $8 \times 10^8 \text{V} \cdot \text{m}^3/\text{cm}^2$.

17. The device of claim 13, wherein the device is included in a programmable logic array.

18. A method comprising:

forming a conductive field-effect transistor (FET) gate on a substrate;

forming an organic ferroelectric gate dielectric on the gate and on the substrate near the gate, the ferroelectric gate dielectric comprising a ferroelectric property that permits electrically programmable adjustment of a FET threshold voltage to programmably configure a functionality of an electrical circuit;

forming a conductive FET source on the gate dielectric near a first edge of the gate;

forming a conductive FET drain on the gate dielectric near a second edge of the gate that is located across the gate from the first edge of the gate;

forming an organic semiconductor FET body region on the gate, the source, and the drain;

forming an organic passivation layer on the semiconductor FET body region; and configuring the gate, the source, and the drain as a FET amplifier to locally amplify a piezoelectric-generated charge, sensed at the gate from a local region of the substrate that is adjacent to the gate, into a resulting current between the source and drain.

19. The method of claim 18, wherein:

forming the ferroelectric gate dielectric comprises spin-casting a PVDF-TrFE co-polymer;

forming the semiconductor FET body region comprises depositing pentacene; and forming the passivation layer comprises depositing parylene.

20. The method of claim 19, wherein:

forming the source and drain comprises depositing gold; and forming the gate comprises depositing chrome or gold.

21. The method of claim 18, comprising forming a plurality of FETs by printing from a master to a target, wherein the master comprises a smaller surface area than the target.

22. The method of claim 21, wherein the printing comprises printing from a substantially cylindrical master to a target sheet, comprising rolling the master along the target sheet.

23. The method of claim 21, comprising individually electrically programming FETs of the plurality of FETs.

24. A method comprising:

providing a FET device comprising:

a substrate;

a conductive field-effect transistor (FET) gate, formed on the substrate;

an organic ferroelectric gate dielectric, formed on the gate and on the substrate near the gate;

a conductive FET source, formed on the gate dielectric near a first edge of the gate;

a conductive FET drain, formed on the gate dielectric near a second edge of the gate that is located across the gate from the first edge of the gate;

an organic semiconductor FET body region, formed on the gate, the source, and the drain;

an organic passivation layer, formed on the semiconductor FET body region; and electrically programming adjustment of a threshold voltage of the FET device to programmably configure a functionality of an electrical circuit; and wherein the gate, the source, and the drain are configured as a FET amplifier to locally amplify a piezoelectric-generated charge, sensed at the gate from a local region of the substrate that is adjacent to the gate, into a resulting current between the source and drain.

25. The method of claim 24, comprising:

providing an array of the FET devices; and individually electrically programming adjustment of a threshold voltage of different FET devices to represent a distinct logic state for the programmed FET device.

* * * * *

UNITED STATES PATENT AND TRADEMARK OFFICE
CERTIFICATE OF CORRECTION

| | | |
|---|---|---|
| PATENT NO. | : 7,858,975 B2 | Page 1 of 1 |
| APPLICATION NO. | : 12/047133 | |
| DATED | : December 28, 2010 | |
| INVENTOR(S) | : Ioannis Kymissis | |

It is certified that error appears in the above-identified patent and that said Letters Patent is hereby corrected as shown below:

In column 16, line 56, in Claim 12, after "FET" insert -- devices --.

Signed and Sealed this
Nineteenth Day of April, 2011

David J. Kappos
*Director of the United States Patent and Trademark Office*